US011956864B2

(12) United States Patent
McCarthy et al.

(10) Patent No.: US 11,956,864 B2
(45) Date of Patent: Apr. 9, 2024

(54) HEATING DEVICE WITH SKIVED FINS AND METHOD FOR PRODUCING A HEATING ROD

(71) Applicant: BorgWarner Ludwigsburg GmbH, Ludwigsburg (DE)

(72) Inventors: Cian McCarthy, Dingle (IE); Kevin Dukes, County Kerry (IE); Ivan Morris, County Kerry (IE)

(*) Notice: Subject to any disclaimer, the term of this patent is extended or adjusted under 35 U.S.C. 154(b) by 367 days.

(21) Appl. No.: 16/825,081

(22) Filed: Mar. 20, 2020

(65) Prior Publication Data

US 2020/0314966 A1    Oct. 1, 2020

(30) Foreign Application Priority Data

Apr. 1, 2019 (DE) .................... 10 2019 108 435.0

(51) Int. Cl.
| | |
|---|---|
| *H05B 3/50* | (2006.01) |
| *H05B 3/06* | (2006.01) |
| *H05B 3/42* | (2006.01) |
| *H05B 3/44* | (2006.01) |
| *H05B 3/46* | (2006.01) |
| *H05K 7/20* | (2006.01) |

(52) U.S. Cl.
CPC ............... *H05B 3/50* (2013.01); *H05B 3/06* (2013.01); *H05B 3/42* (2013.01); *H05B 3/44* (2013.01); *H05B 3/46* (2013.01); *H05K 7/20509* (2013.01); *H05B 2203/017* (2013.01); *H05B 2203/02* (2013.01); *H05B 2203/023* (2013.01)

(58) Field of Classification Search
CPC ...... H05B 3/50; H05B 2203/017; H05B 3/06; H05B 3/42; H05B 3/44; H05B 3/46; H05B 2203/02; H05B 2203/023; H05K 7/20509

USPC ........................................................ 219/530
See application file for complete search history.

(56) References Cited

U.S. PATENT DOCUMENTS

| | | | | |
|---|---|---|---|---|
| 3,502,126 A | * | 3/1970 | Howard .................. | B26D 3/18 83/404.3 |
| 5,198,640 A | * | 3/1993 | Yang .................... | H01C 1/1406 219/505 |
| 5,382,938 A | * | 1/1995 | Hansson .............. | H01C 1/1406 338/114 |

(Continued)

FOREIGN PATENT DOCUMENTS

| | | | | | |
|---|---|---|---|---|---|
| CN | 103234378 A | * | 8/2013 | ......... | F28D 15/0275 |
| DE | 90 03 832 U1 | | 8/1991 | | |

(Continued)

OTHER PUBLICATIONS

Zaward Corporation (Screen capture from YouTube clip entitled "Skived (skiving) heat sink manufacturing process | Scheiben schälen-Prozess # ## ###", uploaded on Sep. 28, 2018 by user "ZAWARD Corporation". Retrieved from Internet: < https://www.youtube.com/watch?v=ghrjJ1OL6jM>). (Year: 2018).*

*Primary Examiner* — Janie M Loeppke
*Assistant Examiner* — Erwin J Wunderlich
(74) *Attorney, Agent, or Firm* — Bose McKinney & Evans LLP

(57) ABSTRACT

Disclosed is a heating device comprising a heating resistor, and a heat sink thermally coupled to the heating resistor, wherein the heat sink comprises corrugated fins that are skived fins integral to the heat sink. Also disclosed is a method for producing a heating rod.

3 Claims, 2 Drawing Sheets

(56) References Cited

U.S. PATENT DOCUMENTS

| | | | |
|---|---|---|---|
| 6,178,292 B1* | 1/2001 | Fukuoka | F28F 9/002 |
| | | | 165/181 |
| 7,332,693 B2* | 2/2008 | Hamburger | H01C 7/02 |
| | | | 219/520 |
| 7,900,692 B2* | 3/2011 | Miyahara | H01L 23/473 |
| | | | 165/80.4 |
| 8,895,898 B2* | 11/2014 | Lim | H05B 3/42 |
| | | | 219/520 |
| 9,661,689 B2* | 5/2017 | Dent | H05B 3/06 |
| 9,863,663 B2* | 1/2018 | Kohl | F24H 3/081 |
| 11,118,810 B2* | 9/2021 | Base | F16L 53/38 |
| 11,255,609 B2* | 2/2022 | Armsden | B23K 1/0012 |
| 2001/0030039 A1 | 10/2001 | Copeland et al. | |
| 2005/0144896 A1* | 7/2005 | Hamburger | H05B 3/50 |
| | | | 52/741.1 |
| 2006/0237441 A1* | 10/2006 | Fujimura | H05B 3/44 |
| | | | 219/544 |
| 2008/0289809 A1* | 11/2008 | Jiang | F28F 21/084 |
| | | | 165/182 |
| 2009/0107985 A1* | 4/2009 | Mori | H05B 3/50 |
| | | | 219/534 |
| 2009/0314764 A1* | 12/2009 | Mori | H05B 3/50 |
| | | | 219/520 |
| 2014/0097179 A1* | 4/2014 | Conway | F24H 3/0429 |
| | | | 29/611 |
| 2015/0098222 A1* | 4/2015 | Lin | F21V 29/83 |
| | | | 362/249.02 |
| 2015/0319807 A1* | 11/2015 | Maher | H05B 3/262 |
| | | | 219/539 |
| 2019/0225054 A1* | 7/2019 | Dukes | B60H 1/2225 |

FOREIGN PATENT DOCUMENTS

| | | | |
|---|---|---|---|
| DE | 203 12 313 U1 | 12/2004 | |
| JP | H 03-44896 U | 4/1991 | |
| JP | H 07-34392 B2 | 4/1995 | |
| JP | 10125836 A | * 5/1998 | |
| JP | 2016084963 A | * 5/2016 | |

* cited by examiner

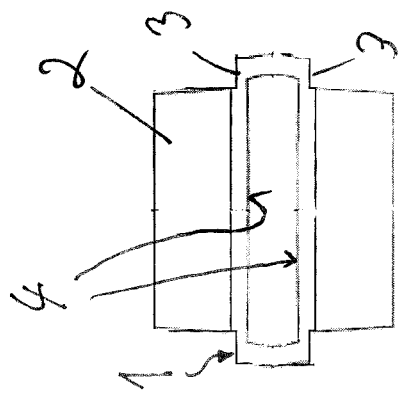
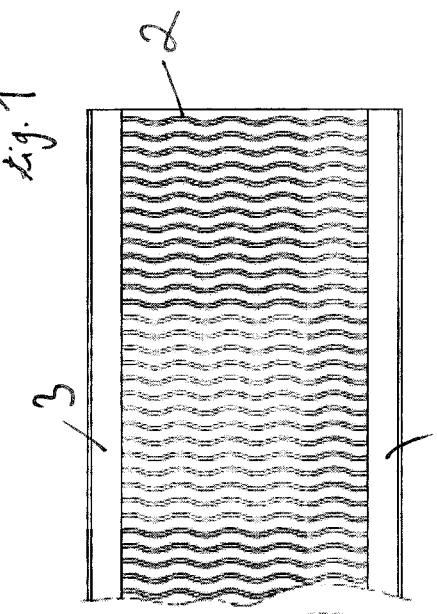
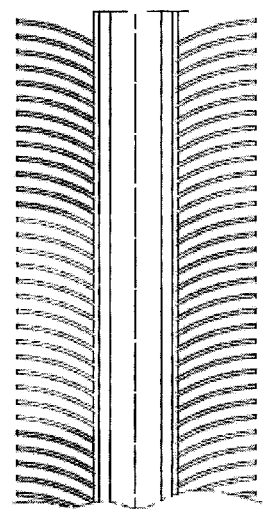
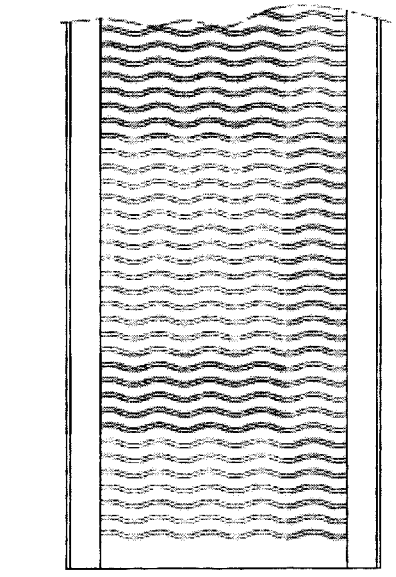
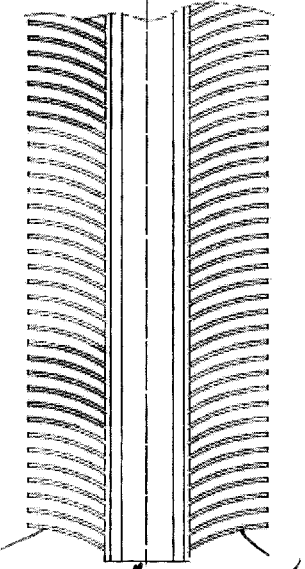

HEATING DEVICE WITH SKIVED FINS AND METHOD FOR PRODUCING A HEATING ROD

RELATED APPLICATIONS

This application claims priority to DE 10 2019 108 435.0, filed Apr. 1, 2019, the entire disclosure of which is hereby incorporated herein by reference.

BACKGROUND

This disclosure refers to a heating device with skived fins and to a method for producing a heating rod. Heating devices are generally known from JP H07-34 392 B2, JP H03-44 896 U, and DE 90 03 832 U1.

Skived heat sink fins are manufactured by peeling fins from a metal surface, e.g., an aluminum tube, using a sharp and accurately controlled blade tool. The tool shaves a small thickness of the material, lifts it up and bends it vertically to form the fin. This process is called skiving. The production of heat sink fins by skiving is disclosed in detail in U.S. Publication No. 2001/0030039 A1, the disclosure of which is incorporated herein by reference.

Heating devices comprising heat sinks with fins produced by skiving have significant advantages over conventional heating devices comprising heat sink fins cut from sheet metal and pushed onto a tube as, e.g., known from DE 203 12 313 U1.

Cutting heat sink fins from sheet metal and pushing them onto the tube involves considerable work. Moreover, the thermal contact between the heat sink fins and the tube can be compromised by oxide layers or dirt. Producing heat sink fins by skiving ensures excellent thermal contact and heat transfer characteristics. Moreover, it reduces the number of parts from which the heating devices are assembled.

SUMMARY

This disclosure shows how the heat transfer characteristics of a heating device comprising a heat sink with skived fins can be improved.

Corrugated fins are produced by skiving with a corrugated blade. Such corrugated fins have a better heat transfer than conventional skived fins that are either flat or slightly curved. The corrugations of such fins run from a proximal end or base of the fin to a distal end or edge. Preferably, each fin has at least three corrugations, e.g., four corrugations or more. The depth of the corrugations is preferably larger than the material thickness of each sheet of metal forming a fin.

An advantageous refinement is that the heat sink can be part of a housing in which the heating resistor is arranged. The housing may be a tube, for example, a flat tube.

Another advantageous refinement is that the heating resistor can be a ceramic heating resistor, e.g., a PTC (positive temperature coefficient) resistor. Such resistors may be made on the basis of barium titanate. As PTC resistors show a marked increase in their electrical resistance at a critical temperature, they are inherently protected from overheating beyond their critical temperature. The tube may contain just one heating resistor or it may contain several heating resistors.

A ceramic resistor can be electrically contacted inside the tube by means of a contact plate. A suitable contact plate can be cut from sheet metal and protrude from the tube, thereby providing an electrical terminal for connecting the heating device to an electrical power supply. The tube itself can be used for connecting the resistor to ground. It is also possible to provide a second contact plate inside the tube and arranging the heating resistor between the contact plates.

Another advantageous refinement is that the resistor(s) and the contact plate(s) are held by a mounting frame. Thereby, assembly can be facilitated.

In principle, the heat sink fins can be created by skiving before the heating resistor is arranged in the tube or after. An advantageous refinement is that the heating resistor is arranged in the tube already provided with skived fins, the tube is then plastically deformed by compressing it. Compressing the tube improves the thermal connection of the heating resistor(s) to the tube. The tube is preferably provided with ledges running along opposite edges of the tube. The fins are arranged between the ledges and as such have a smaller width than the tube. The tube can then be compressed by exerting pressure on the ledges.

Another refinement uses a flat tube that has at least one convex inner surface, e.g., a curved surface. The ceramic resistor is placed in the tube such that one of the contact sides of the ceramic resistor faces the convex inner tube surface. The contact sides of a ceramic resistor are the sides on which it is electrically contacted, e.g., by a contact sheet. Usually the ceramic resistor is plate-shaped. The two major sides of such a plate-shaped resistor are usually the contact sides.

When the flat tube is compressed and thereby made even flatter, thermal contact of the tube to the ceramic resistor is improved. The convex inner tube surface gradually deforms during the compression process and improves thermal contact. The convex inner tube surface may touch the resistor if the tube is used to electrically contact the resistor. Usually the convex inner tube surface does not touch the resistor because a contact sheet and electrical insulation are placed between them.

Two opposing inner tube surfaces can be convex, i.e., bulge inwardly towards the contact faces of the ceramic resistor. It is also possible that only one inner tube surface facing a contact side of the resistor is convex whereas the other side is flat. In both cases the height of the interior space of the tube decreases from the narrow sides of the tube towards the middle due to the convex shape of the inner tube surface. The height of the interior space of the tube is to be measured from one fin carrying broad side to the opposite broad side. This height is reduced when the tube is compressed.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein:

FIG. 1 shows a side view of a heating device;

FIG. 2 shows a top view of the heating device;

FIG. 3 shows a front view of the tube housing of the heating device; and

DESCRIPTION

Figure 4:
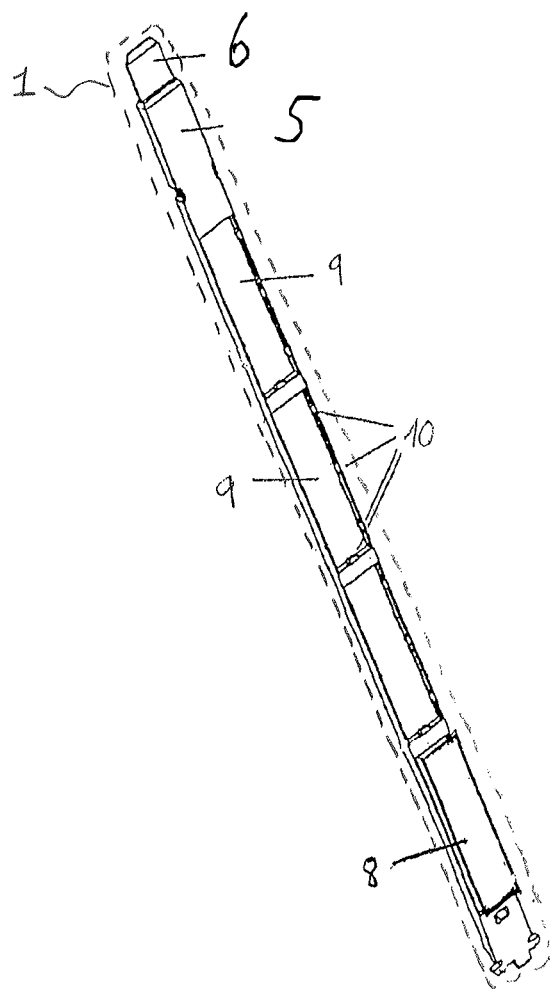
FIG. 4 shows a mounting frame including a contact plate and a heating resistor of the heating device.

The embodiments described below are not intended to be exhaustive or to limit the invention to the precise forms disclosed in the following description. Rather, the embodiments are chosen and described so that others skilled in the art may appreciate and understand the principles and practices of this disclosure.

FIGS. 1 to 3 show a heating device, more precisely the tube housing of a heating device that is provided as a heat sink. The housing is a flat tube 1 comprising heat sink fins 2. The heat sink fins 2 are skived fins integral to the tube 1. This means that the fins 2 were made by skiving from a flat tube. In the skiving process fins were peeled from the flat tube using a sharp and accurately controlled blade tool. The blade tool shaves a small thickness of the tube surface, lifts it up and bends it vertically to form the fins 2 one after another. Two opposite sides of the tube 1 are provided with fins 2. The fins 2 are provided on broad sides of the tube 1. These broad sides are connected by narrow sides which are free from fins. The tube 1 and the fins 2 are a single piece, e.g., of aluminum.

The fins 2 are corrugated fins and therefore have a wavy shape as can be seen in FIG. 2. Each fin 2 has several corrugations, e.g., four or more corrugations, running from a proximal end, where the fins 2 are connected to tube 1, to a distal end of the fins 2. Corrugated fins are produced by skiving when a corrugated blade is used.

The flat tube 1 has two opposing broad sides carrying fins 2 and narrow sides connecting the broad sides. As shown in FIG. 3, the width of the tube 1 is larger than the width of the fins 2. On both sides of the fins 2 is a ledge 3 to which a pressing tool can be applied for compressing the tube 1 after a ceramic PTC resistor has been arranged inside the tube 1.

Inside the tube 1 is a mounting frame 5 holding a contact plate 6 and one or more ceramic heating resistors 8, e.g., PTC heating resistors. The mounting frame 5 is shown in FIG. 4 with only one ceramic heating resistor 8, the other three compartments 9 of the mounting frame 5 are empty for simplicity, but could of course also be filled with heating resistors 8. The mounting frame 5 may be provided with noses 10 for holding the ceramic heating resistors 8 in the compartments 9.

The heating resistors 8 are electrically contacted by the contact plate 6 which protrudes from the tube 1 forming a terminal for connecting to an electrical power source. The contact plate 6 is electrically insulated from the tube 1. A second contact plate may be provided inside the tube 1, or the tube 1 itself may be used to provide a ground connection for the heating resistors 8.

The resistors 8 are plate-shaped. They are electrically contacted at their large front and back sides, which each face one of the two fin carrying broad sides of the tube 1. The front and back sides of the resistors 8 are the contact faces of the resistors.

The heating device can be produced by arranging the heating resistors 8 together with the mounting frame 5 and the contact plate 6 inside tube 1. The tube 1 is then plastically deformed by compressing it. Thereby, thermal contact between the heating resistors 8 and the tube 1 is improved.

Both broad sides of the tube 1 have an inner surface 4 that is convex. Thus, the inside of the tube 1 bulges towards the contact faces of the resistors 8. Hence, the height of the interior space of the tube 1 decreases from the narrow sides towards the middle. The height of the interior space is measured in a direction from one of the fin carrying broad sides to the opposite fin carrying broad side. The inwardly curved inner surface of the broad sides facilitates the compression process and leads to an improved thermal coupling between tube 1 and resistors 8.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

LIST OF REFERENCE SIGNS 1 tube
2 fin
3 ledge
4 convex surface
5 mounting frame
6 contact plate
8 resistor
9 compartment
10 nose

What is claimed is:

1. A method for producing a heating rod, comprising:
providing a tube with heat sink fins by skiving, wherein the skiving is done with a blade, whereby heat sink fins are formed by the skiving;
providing the tube as a flat tube having broad sides and narrow sides, at least one of the broad sides having a surface that bulges inward, wherein the fins are positioned on at least one of the broad sides of the tube and ledges are positioned on opposite edges of the tube outside a width spanned by the fins;
then inserting a ceramic heating resistor in the tube; and
then compressing the tube by applying pressure to at least one of the ledges, whereby the flat tube is reduced in thickness and the at least one of the broad sides that bulges inward is flattened by the compressing, and whereby the pressure is applied to the at least one of the ledges after the fins are present on the tube.

2. The method for producing a heating rod according to claim 1, wherein the applying pressure comprises applying pressure to both ledges of the tube.

3. The method for producing a heating rod according to claim 2, wherein both broad sides are flattened by the compressing.

* * * * *